(12) United States Patent
Lee

(10) Patent No.: US 7,701,786 B2
(45) Date of Patent: Apr. 20, 2010

(54) SEMICONDUCTOR MEMORY DEVICE

(75) Inventor: Sang-Hee Lee, Kyoungki-do (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 736 days.

(21) Appl. No.: 11/528,641

(22) Filed: Sep. 28, 2006

(65) Prior Publication Data
US 2007/0070785 A1 Mar. 29, 2007

(30) Foreign Application Priority Data
Sep. 29, 2005 (KR) .................. 10-2005-0091679
May 30, 2006 (KR) .................. 2006-0049004

(51) Int. Cl.
*G11C 7/00* (2006.01)
(52) U.S. Cl. .................. 365/189.11; 365/191; 365/194; 365/222
(58) Field of Classification Search .................. 365/230, 365/189.11, 194, 207, 222, 205
See application file for complete search history.

(56) References Cited

U.S. PATENT DOCUMENTS

| | | | | |
|---|---|---|---|---|
| 5,764,580 | A * | 6/1998 | Suzuki et al. | ............... 365/205 |
| 6,347,058 | B1 | 2/2002 | Houghton et al. | |
| 6,380,784 | B1 * | 4/2002 | Jeong | .......................... 327/261 |
| 6,853,593 | B1 | 2/2005 | Bae | |
| 7,020,043 | B1 | 3/2006 | Lee | |
| 2005/0243624 | A1 | 11/2005 | Jang | |
| 2006/0083081 | A1 * | 4/2006 | Park et al. | ................... 365/191 |

FOREIGN PATENT DOCUMENTS

| | | |
|---|---|---|
| JP | 2003-068073 | 3/2003 |
| KR | 10-0228343 | 8/1999 |
| KR | 10-2001-0037706 | 5/2001 |
| KR | 10-2001-0060984 | 7/2001 |
| KR | 2002-0053491 | 7/2002 |
| KR | 1020040041750 A | 5/2004 |
| KR | 10-2004-0059982 | 7/2004 |
| KR | 1020060104891 A | 10/2006 |

OTHER PUBLICATIONS

Korean Office Action issued in corresponding Korean Patent Application No. KR 10-2006-0049004, dated Apr. 25, 2007.
Notice of Allowance issued from Korean Intellectual Property Office on Apr. 23, 2009 with an English Translation.

* cited by examiner

*Primary Examiner*—Pho M Luu
*Assistant Examiner*—Tha-O Bui
(74) *Attorney, Agent, or Firm*—IP & T Law Firm PLC

(57) ABSTRACT

A semiconductor memory device changes a pulse width of an over driving signal according to operation modes, which differ by a degree of accessing memory banks during an over driving operation. An over driver supplies an RTO line of the bit line sense amplifier with an over driving voltage in response to the over driving signal and an over driving signal generator changes a pulse width of the over driving signal according to the operation modes. An increase in the VCORE due to excess supply voltage VDD in the over driving operation is prevented.

17 Claims, 4 Drawing Sheets

SEMICONDUCTOR MEMORY DEVICE

FIELD OF THE INVENTION

The present invention relates to a semiconductor memory device; and, more particularly, to a scheme for generating an over driving signal of a bit line sense amplifier.

DESCRIPTION OF RELATED ARTS

Scaling down of line width and cell size in integrated semiconductor memory devices proceeds continuously. Accordingly, as the level of the supply voltage (VDD) is lowered, modification of the architecture of the semiconductor memory device operating under low-power system is required.

Semiconductor memory chips now are provided with an internal voltage generating circuit generating an internal voltage from an external voltage, i.e., the VDD, and supplied with a predetermined voltage as required by internal circuits therein. Particularly, in a semiconductor memory device including a bit line sense amplifier such as a DRAM, a core voltage (VCORE) is used for sensing cell data.

The level of the required VCORE becomes lower under a trend of lower VDD. Accordingly, amplifying a large plurality of cell data rapidly by the VCORE can cause overload.

A method of over driving a bit line sense amplifier is used to solve the problem. The over driving method drives the pull-up voltage line (RTO line) of the bit line sense amplifier with a high voltage that is higher than the VCORE, usually the VDD, at an initial operation of the bit line sense amplifier after data stored in the memory cell is transmitted to the bit line pair.

FIG. 1 is a block diagram of a conventional bit line sense amplifier.

As shown, the bit line sense amplifier 101 includes a driver 102 in order to supply a RTO line with the VDD or the VCORE, and a pull-down voltage line (SB line) with a ground voltage (VSS).

The driver 102 is provided with a first PMOS transistor P1, NMOS transistors N1 and N2 and a precharge unit. The first PMOS transistor P1, operating as an over driver, receives an over driving signal OVDP through a gate. The first NMOS transistor N1, operating as a normal driver, receives a normal driving signal SAP through a gate. The first NMOS transistor N1 is connected between the first PMOS transistor P1 and the RTO line. The second NMOS transistor N2, operating as a pull-down driver, receives a pull-down driving signal SAN through a gate. The second NMOS transistor N2 is connected between the SB line and the VSS. The precharge unit precharges the RTO and the SB lines.

In operation of the bit line sense amplifier 101, a word line of a cell array is activated in response to an active command. Accordingly a charge, i.e., data, stored in a memory cell is transmitted to the bit line pair BL and BLb. The bit line pair BL and BLb has a difference in the charge level.

After a predetermined delay time, the bit line sense amplifier 101 is enabled. The bit line sense amplifier 101 amplifies the level of the bit line pair BL and BLb to the VCORE and the VSS respectively. At this time the first and the second NMOS transistors N1 and N2 drive the RTO and the SB lines respectively.

In order to improve a tRCD parameter, the VDD higher than the VCORE is used to drive the RTO line before driving by the VCORE. The tRCD parameter, i.e., Row address to Column address Delay, represents a delay time from a row address input time to a column address input time.

The VCORE node 109 of the normal driver is connected to the VDD node of the over driver to improve amplifying efficiency of data, which is controlled by the over driving signal OVDP. This operation is an over driving operation of the bit line sense amplifier 101.

FIG. 2 is a schematic circuit diagram of a conventional over driving signal generator.

The over driving signal generator is provided with a first delay unit 201, a first NAND gate NAND5 and inverters INV1 and INV2. The first delay unit 201 provided with an even number of inverters receives an enable signal SAEN. The enable signal SAEN is generated in response to an active signal and a precharge signal. The first inverter INV1 inverts an output of the first delay unit 201. The first NAND gate NAND5 receives the enable signal SAEN and an output of the first inverter INV1. The second inverter INV2, inverting an output of the first NAND gate NAND5, outputs the over driving signal OVDP.

The over driving signal OVDP has an activated period as long as a delay time of the first delay unit 201. Accordingly, a period of the over driving operation is determined by the first delay unit 201.

However, the activated period of the over driving signal OVDP is longer than required period in 4-bit or 8-bit organization mode, wherein data are transferred by 4-bit or 8-bit transfers. A burst length of the 4-bit or the 8-bit organization mode is half of a burst length of a 16-bit organization mode in a DDR2 having more than 512M density. As the level of the VCORE would undergo too great an increase, the semiconductor memory device further includes a VCORE discharge unit in order to decrease the level of the increased VCORE to the level of a reference voltage.

The VCORE discharge unit senses the level of the VCORE and discharges the VCORE when the VCORE is higher than the reference voltage. However, the VCORE discharge unit is not necessary unless the VCORE increased is too great. Neither is the discharged VCORE.

An IDD5 mode, i.e., an auto refresh operation mode or 4 bank active mode, and a multi-bit parallel test mode are supplied with the VCORE at the over driving operation. In the multi-bit parallel test mode, wherein multi-bit data is input and output through I/O pins, writing and reading operations are performed through four banks and a sensing current for the bit line pair is four times as much as that in a normal mode.

Accordingly, if the activated period of the over driving signal OVDP is shorter than the required operation period, the amount of VCORE is insufficient. Because a subsequent active command is input before the VCORE is increased to the reference voltage, malfunctions are caused.

The amount of the supplied VCORE is different according to the burst length of the banks. After the over driving operation, the level of the VCORE can be unduly decreased or increased in the conventional device. The conventional semiconductor memory device further includes an unnecessary unit such as the VCORE discharge unit.

SUMMARY OF THE INVENTION

It is, therefore, an object of the present invention to provide a semiconductor memory device changing a pulse width of the over driving signal OVDP according to the operation modes, corresponding to the number of accessing banks performing the over driving operation.

Another object of the present invention is a semiconductor memory device that prevents increase in the VCORE due to excess supplies of the VDD, at the over driving operation.

A further object of the present invention is a semiconductor memory device that eliminates discharging operation for the VCORE.

In accordance with an aspect of the present invention, there is provided a semiconductor memory device, including an over driver for supplying the RTO line of the bit line sense amplifier with the over driving voltage in response to the over driving signal OVDP, and an over driving signal generator for changing a pulse width of the over driving signal OVDP according to the operation mode.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE INVENTION

Hereinafter, a semiconductor memory device having a shared bit line sense amplifier scheme and a driving method thereof in accordance with exemplary embodiments of the present invention will be described in detail with reference to the accompanying drawings.

Figure 1:
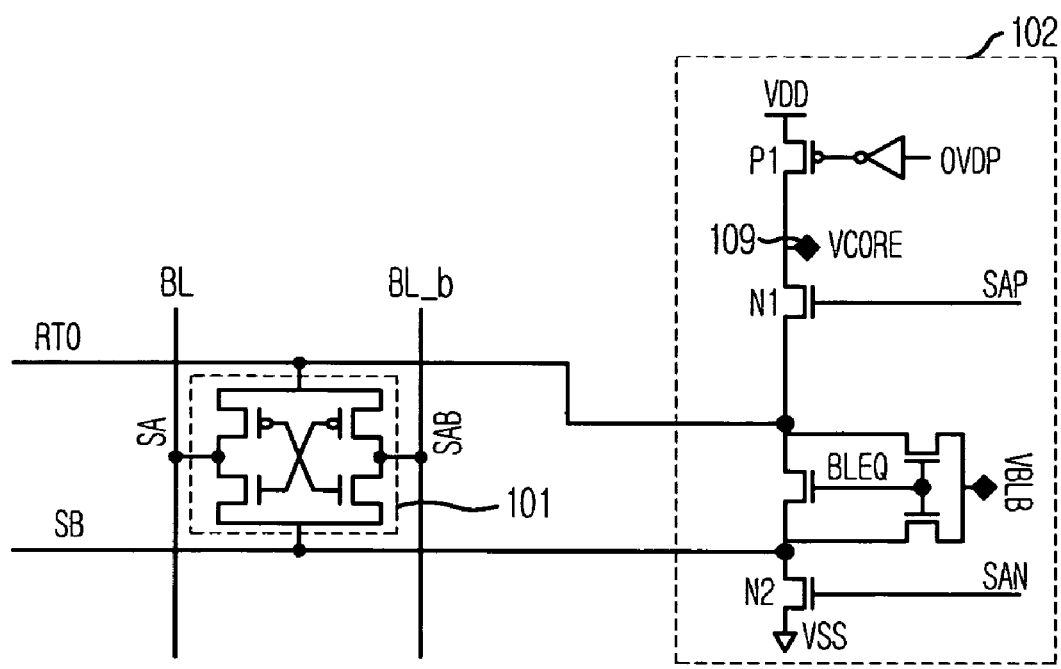
FIG. 1 is a block diagram of a conventional bit line sense amplifier.
Figure 2:
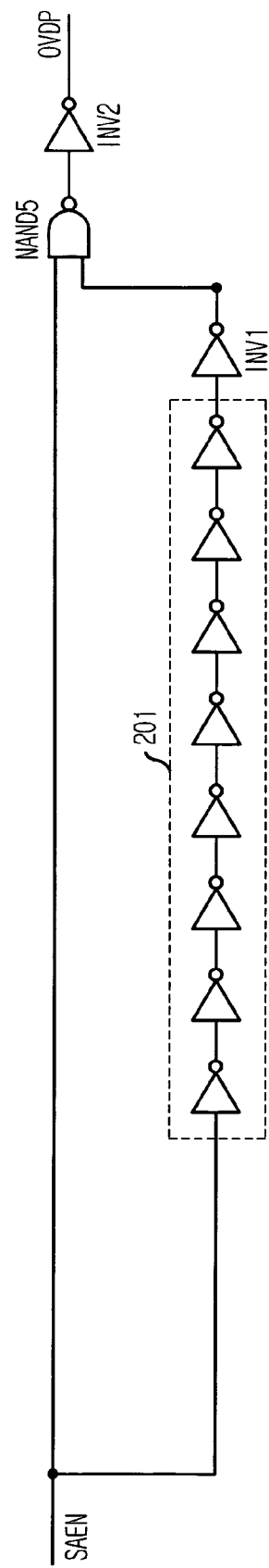
FIG. 2 is a schematic circuit diagram of a conventional over driving signal generator.
Figure 3:
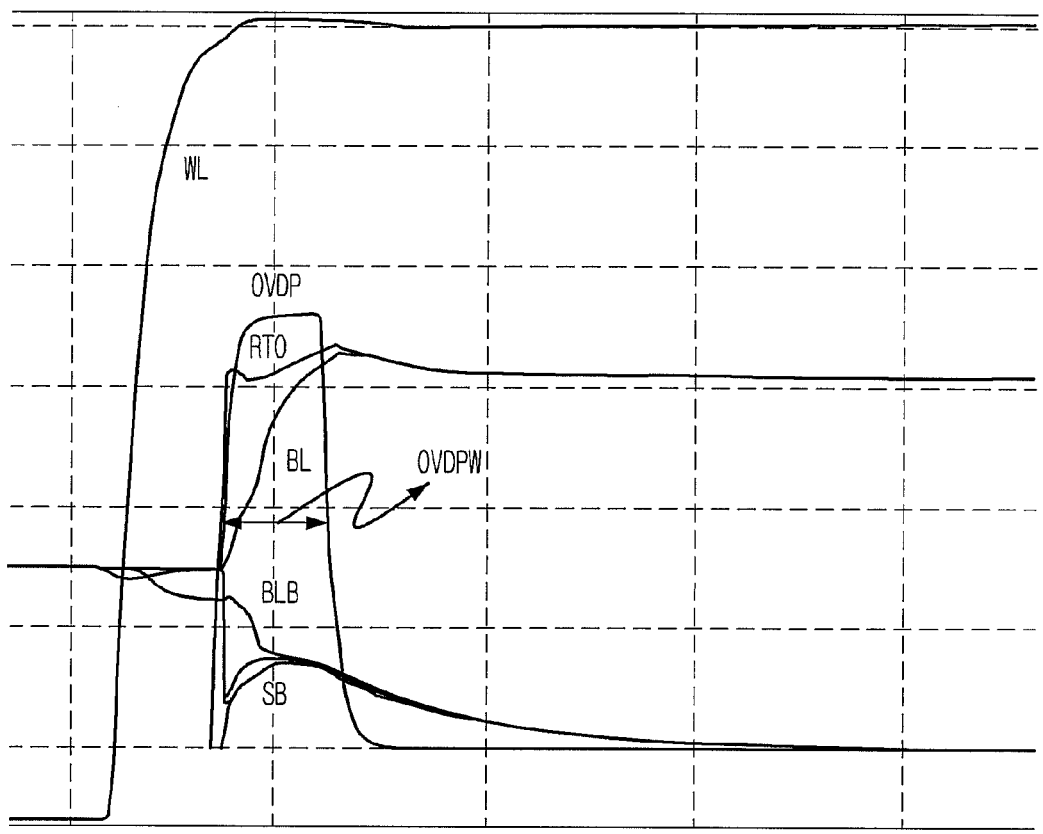
FIG. 3 is a waveform diagram for explaining an over driving signal having a changeable pulse width in accordance with the present invention.

FIG. 3 is a waveform diagram for explaining an over driving signal OVDP having a changeable pulse width in accordance with the present invention.

The pulse width of the over driving signal OVDP is changed according to the modes, such as 4-bit organization, 8-bit organization, IDD5 and multi-bit parallel test modes.

The changes of voltage level in the bit line pair BL and BLb can be different according to the pulse width of the over driving signal OVDP.

Figure 4:
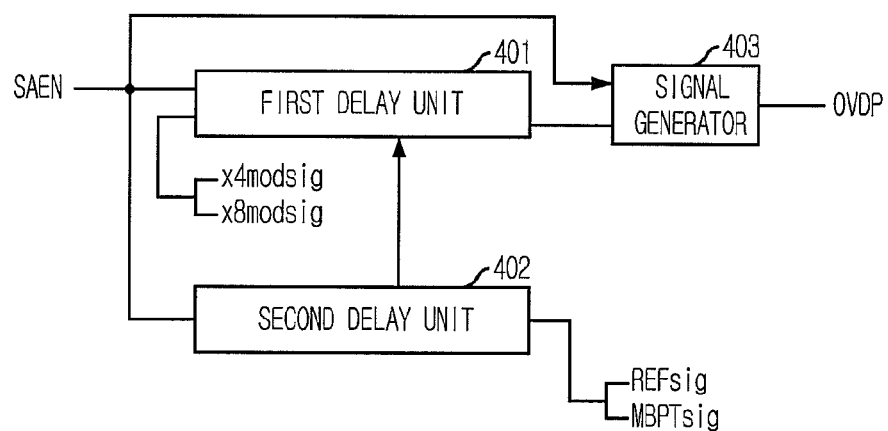
FIG. 4 is a block diagram of an over driving signal generator in accordance with the present invention.

FIG. 4 is a block diagram of an over driving signal generator in accordance with the present invention.

As shown, the over driving signal generator includes delay units 401 and 402 and a signal generator 403. The first delay unit 401 delays the enable signal SAEN in response to 4-bit or 8-bit organization mode signal x4modsig or x8modsig. The second delay unit 402 delays the enable signal SAEN in response to multi-bit parallel test or refresh signal MBPTsig or REFsig. The signal generator 403, receiving the enable signal SAEN and an output of the first delay unit 401, generates the over driving signal OVDP.

The 4-bit organization mode signal x4modsig, the 8-bit organization mode signal x8modsig, the refresh signal REFsig and the multi-bit parallel teat signal MBPTsig are representative signals according to each mode distinguished by the amount of the VCORE used. Other operation signals having similar characters related to the VCORE could be substituted.

In order to distinguish each mode based on the amount of the VCORE used, the number of banks accessed is used. That is, each mode could be distinguished according to the burst length of the unit banks.

When the 4-bit organization mode signal x4modsig or the 8-bit organization mode signal x8modsig, meaning that the VCORE is used less, is activated after the enable signal SAEN is input, the first delay unit 401 changes the pulse width of the over driving signal OVDP. Thereafter, the second delay 402 controls the pulse width of the over driving signal OVDP when the refresh signal REFsig or the multi-bit parallel test signal MBPTsig, meaning that the VCORE is used more, is activated. The second delay 402 increases the delay of the enable signal SAEN, transmitting the output to the first delay unit 401.

Figure 5:
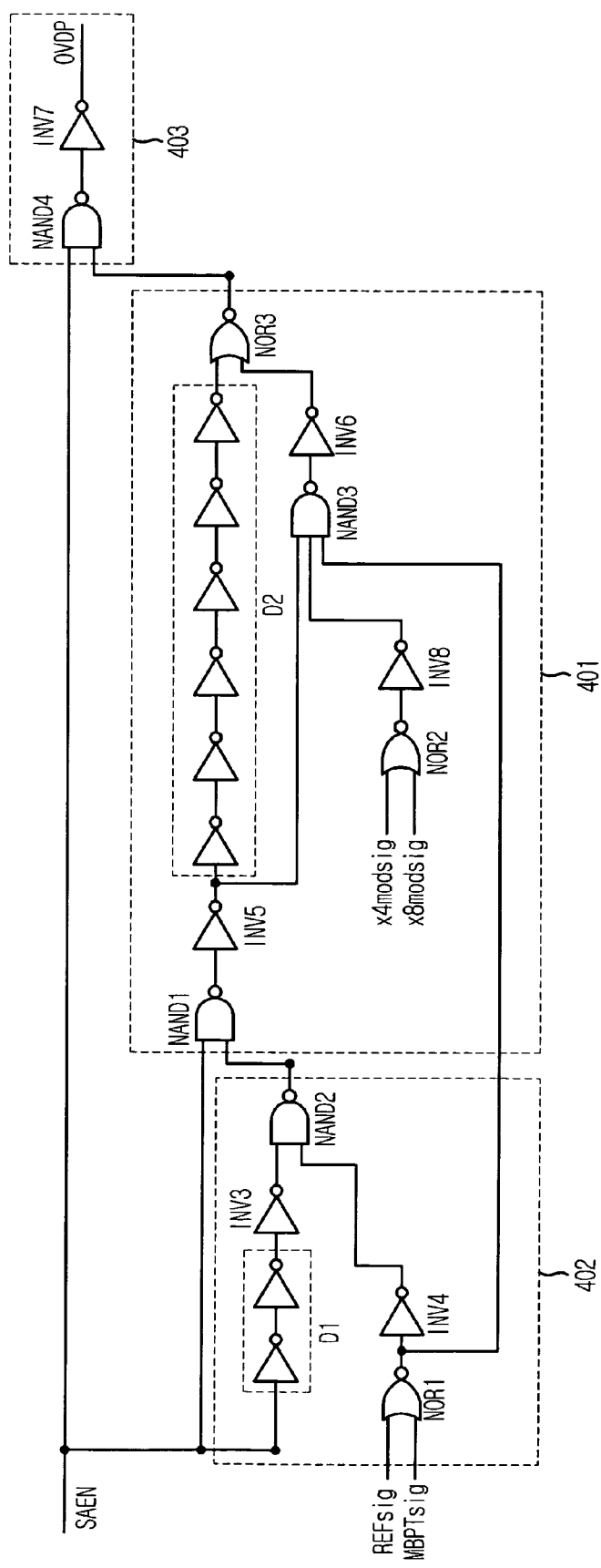
FIG. 5 is a schematic circuit diagram of the over driving signal generator shown in FIG. 4.

FIG. 5 is a schematic circuit diagram of the over driving signal generator shown in FIG. 4.

As shown, the over driving signal generator is provided with delays D1 to D2, inverters INV3 to INV8, NOR gates NOR1 to NOR3 and NAND gates NAND1 to NAND4. The first delay D1, including two inverters, delays the enable signal SAEN generated in response to the active and the precharge signals. The first inverter INV3 inverts an output of the first delay D1. The first NOR gate NOR1 receives the refresh signal REFsig and the multi-bit parallel test signal MBPTsig. The second inverter INV4 inverts an output of the first NOR gate NOR1. The second NAND gate NAND2 receives outputs of the first and the second inverters INV3 and INV4. The first NAND gate NAND1 receives the enable signal SAEN and an output of the second NAND gate NAND2. The third inverter INV5 inverts an output of the first NAND gate NAND1. The second delay D2, including six inverters, delays an output of the third inverter INV5. The second NOR gate NOR2 receives the 4-bit organization mode signal x4modsig and the 8-bit organization mode signal x8modsig. The sixth inverter INV8 inverts an output of the second NOR gate NOR2. The third NAND gate NAND3 receives outputs of the third inverter INV5, the sixth inverter INV8 and the first NOR gate NOR1. The fourth inverter INV6 inverts an output of the third NAND gate NAND3. The third NOR gate NOR3 receives outputs of the second delay D2 and the fourth inverter INV6. The fourth NAND gate NAND4 receives the enable signal SAEN and an output of the third NOR gate NOR3. The fifth inverter INV7 inverts an output of the forth NAND gate NAND4.

The refresh signal REFsig is activated in response to a refresh command. The multi-bit parallel test signal MBPTsig is activated in response to a multi-bit parallel test command. The 4-bit organization mode signal x4modsig is activated in a 4-bit organization mode. The 8-bit organization mode signal is activated in a 8-bit organization mode.

When there are no signals activated, the over driving signal OVDP is delayed by a delay time of the second delay D2. Thereafter, if the 4-bit organization mode signal x4modsig or the 8-bit organization mode signal x8modsig is activated, the over driving signal OVDP is output without the delay time b the second delay D2. When the refresh signal REFsig or the multi-bit parallel test signal MBPTsig is activated, the over driving signal delayed by delay times of the first and the second delays D1 and D2 is generated.

The refresh signal REFsig or the multi-bit parallel test signal MBPTsig is activated at the refresh operation or multi-bit parallel test mode, wherein the VCORE is used more. Accordingly, the over driving signal OVDP is activated in a longer period. That is, in the refresh or the multi-bit parallel test operation, the over driving signal OVDP is activated in a longer period without reference to operation modes of the semiconductor memory device such as 4-bit, 8-bit and 16-bit organization modes. Disregarding delays in elements, the activation period is determined by the delay times of the first delay D1 and the second delay D2.

The 4-bit organization mode signal x4modsig or the 8-bit organization mode signal x8modsig is activated at the 4-bit or the 8-bit organization mode, wherein the VCORE is used less. Accordingly, the over driving signal OVDP is activated in a shorter period. The burst length at the 4-bit or the 8-bit organization mode is half of that at the 16-bit organization mode. Current consumption is reduced and increase of the VCORE is prevented by shortening the pulse width of the over driving signal OVDP.

It is important that the pulse width of the over driving signal OVDP is lengthened at the refresh or the multi-bit parallel test operation, in spite of the 4-bit or the 8-bit organization mode.

As described above, the pulse width of the over driving signal OVDP is changed according to the operation modes, corresponding to the number of accessing banks performing the over driving operation in the present invention.

Accordingly, at the over driving operation, increase of the VCORE due to excess supplies of the VDD is prevented. Unnecessary operation discharging of the VCORE is also prevented.

The present invention is applicable to various other embodiments and methods.

For example, in the above description, the input and output signals are high level of active signals. The invention is also applicable to a change in polarity of the input and output signals. Also, the over driving signal generator may contain equivalent plural logic elements.

In the present invention, the period of the over driving operation is changed by changing the pulse width of the over driving signal OVDP, which controls over driving operation. The VCORE is distributed efficiently according to an operation of the semiconductor memory device. At the over driving operation, increase of the VCORE due to excess supplies of the VDD is prevented.

Unnecessary operation discharging of the VCORE is prevented. A stable operation is obtained and the characters of the semiconductor memory device such as tRCD and tWR are improved.

The present application contains subject matter related to Korean patent applications Nos. 10-2005-0091679 and 10-2006-0049004, filed in the Korean Patent Office on Sep. 29, 2005 and May 30, 2006, respectively, the entire contents of which are incorporated herein by reference.

While the present invention has been described with respect to certain preferred embodiments, it will be apparent to those skilled in the art that various changes and modifications may be made without departing from the scope of the invention as defined in the following claims.

What is claimed is:

1. A semiconductor memory device, comprising:
   an over driver for supplying a pull-up voltage line of a bit line sense amplifier with an over driving voltage in response to an over driving signal; and
   an over driving signal generator for changing a pulse width of the over driving signal according to an operation mode,
   wherein the operation mode includes a refresh mode, and, at the refresh mode, the over driving signal is enabled for a pulse width longer than a pulse width of the over driving signal at a normal mode.

2. The semiconductor memory device of claim 1, wherein the operation mode corresponds to a number of memory banks to be accessed in an over driving operation.

3. The semiconductor memory device of claim 1, wherein the operation mode further includes a multi-bit parallel test mode, a 4-bit organization mode and a 8-bit organization mode, and wherein the multi-bit test mode and the refresh operation mode are for accessing all memory banks and the 4-bit organization mode and 8-bit organization mode are for accessing a fewer number of memory banks.

4. The semiconductor memory device of claim 3, wherein the pulse width of the over driving signal is lengthened at the refresh operation or the multi-bit parallel test mode, compared with a pulse width of the over driving signal at the 4-bit organization mode or the 8-bit organization mode.

5. The semiconductor memory device of claim 4, wherein the over driving signal generator includes:
   a first delay unit for delaying an enable signal of the bit line sense amplifier in response to a 4-bit organization mode signal or a 8-bit organization mode signal;
   a second delay unit for delaying the enable signal in response to a multi-bit parallel test mode signal and a refresh operation mode signal; and
   a signal generator for receiving the enable signal and an output of the first delay unit and generating the over driving signal.

6. The semiconductor memory device of claim 5, wherein the first delay unit includes:
   a first NAND gate for receiving the enable signal and an output of the second delay unit;
   a first inverter for inverting an output of the first NAND gate;
   a first delay for delaying an output of the first inverter;
   a first NOR gate for receiving 4-bit organization mode signal and 8-bit organization mode signals;
   a second inverter for inverting an output of the first NOR gate;
   a second NAND gate for receiving outputs of the first inverter, the second inverter and the second delay unit;
   a third inverter for inverting an output of the second NAND gate; and
   a second NOR gate for receiving outputs of the first delay and the third inverter.

7. The semiconductor memory device of claim 6, wherein the second delay unit includes:
   a third NOR gate for receiving a refresh operation mode signal and a multi-bit parallel test mode signal;
   a second delay for delaying the enable signal;
   a fourth inverter for inverting an output of the second delay;
   a fifth inverter for inverting an output of the third NOR gate; and
   a third NAIND gate for receiving outputs of the fourth and the fifth inverters.

8. The semiconductor memory device of claim 7, wherein the signal generator includes:
   a fourth NAND gate for receiving the enable signal and an output of the second NOR gate; and
   a sixth inverter for inverting an output of the fourth NAND gate.

9. The semiconductor memory device of claim 1, wherein the over driving voltage includes a supply voltage VDD.

10. The semiconductor memory device of claim 5, wherein the refresh operation mode signal is activated in response to a refresh command, the multi-bit parallel test mode signal is activated in response to a multi-bit parallel test command, the 4-bit organization mode signal is activated at the 4-bit organization mode, wherein data are transferred by 4-bit, and the 8-bit organization mode signal is activated at the 8-bit organization mode, wherein data are transferred by 8-bit.

11. A semiconductor memory device for generating a pulse, comprising:
- a first delay unit for receiving an enable signal and changing a pulse width of the enable signal according to an operation mode and a burst length; and
- a pulse generator for combining the enable signal and an output of the first delay unit to generate the pulse, wherein the operation mode includes a refresh mode, and, at the refresh mode, the pulse is enabled for a pulse width longer than a pulse width of the pulse at a normal mode.

12. The semiconductor memory device of claim 11, wherein the burst length is one of 4-bit and 8-bit.

13. The semiconductor memory device of claim 11, further comprising:
- a second delay unit for receiving the enable signal and delaying the enable signal according to the operation mode.

14. The semiconductor memory device of claim 13, wherein the operation mode further includes a test mode.

15. The semiconductor memory device of claim 11, wherein the first delay unit includes:
- a first NAND gate for receiving the enable signal and an output of the second delay unit;
- a first inverter for inverting an output of the first NAND gate;
- a first delay for delaying an output of the first inverter;
- a first NOR gate for receiving 4-bit organization signal and 8-bit organization mode signals;
- a second inverter for inverting an output of the first NOR gate;
- a second NAND gate for receiving outputs of the first inverter, the second inverter and the second delay unit;
- a third inverter for inverting an output of the second NAND gate; and
- a second NOR gate for receiving outputs of the first delay and the third inverter.

16. The semiconductor memory device of claim 13, wherein the second delay unit includes:
- a third NOR gate for receiving a refresh operation mode signal and a multi-bit parallel test mode signal;
- a second delay for delaying the enable signal;
- a fourth inverter for inverting an output of the second delay;
- a fifth inverter for inverting an output of the third NOR gate; and
- a third NAND gate for receiving outputs of the fourth and the fifth inverters.

17. The semiconductor memory device of claim 11, wherein the signal generator includes:
- a fourth NAND gate for receiving the enable signal and an output of a NOR gate; and
- a sixth inverter for inverting an output of the forth NAND gate.

* * * * *